United States Patent
Lin et al.

(10) Patent No.: US 11,114,984 B2
(45) Date of Patent: Sep. 7, 2021

(54) AUDIO DEVICE FOR REDUCING POP NOISE AND PROCESSING METHOD THEREOF

(71) Applicant: REALTEK SEMICONDUCTOR CORP., Hsinchu (TW)

(72) Inventors: Shih-Hsin Lin, Hsinchu (TW); Che-Hung Lin, Hsinchu (TW); Yi-Chang Tu, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 132 days.

(21) Appl. No.: 16/520,999

(22) Filed: Jul. 24, 2019

(65) Prior Publication Data

US 2020/0252030 A1    Aug. 6, 2020

(30) Foreign Application Priority Data

Feb. 1, 2019  (TW) .................................. 108104170

(51) Int. Cl.
| | |
|---|---|
| *H03F 1/14* | (2006.01) |
| *H03F 1/30* | (2006.01) |
| *H03M 1/08* | (2006.01) |
| *H03G 3/34* | (2006.01) |
| *H03M 1/66* | (2006.01) |

(52) U.S. Cl.
CPC ............ *H03F 1/305* (2013.01); *H03G 3/348* (2013.01); *H03M 1/0881* (2013.01); *H03F 2200/03* (2013.01); *H03F 2200/507* (2013.01); *H03M 1/66* (2013.01)

(58) Field of Classification Search
CPC ............... H03F 1/305; H03F 2200/507; H03F 2200/03; H03F 3/187; H03G 3/348
USPC ......................................... 330/10, 251, 207 A
See application file for complete search history.

(56) References Cited

U.S. PATENT DOCUMENTS

2014/0314245 A1* 10/2014 Asada .................. H04R 1/1083
381/71.6

* cited by examiner

*Primary Examiner* — Khanh V Nguyen
*Assistant Examiner* — Khiem D Nguyen
(74) *Attorney, Agent, or Firm* — Birch, Stewart, Kolasch & Birch, LLP

(57) ABSTRACT

An audio device for reducing pop noise is adapted to compensate for a direct current (DC) offset of an audio source signal and output the audio source signal to an audio playing device. The audio device includes a linear operation circuit, an adder, a digital-to-analog circuit, and an amplification circuit. The digital-to-analog circuit is coupled between the adder and the amplification circuit. The linear operation circuit generates a DC offset value based on a linear equation, a temperature parameter, a slope parameter, and a constant. The adder is configured to process an input signal and the DC offset value to generate a calibration signal. The digital-to-analog circuit is configured to convert a calibration signal in a digital form to a calibration signal in an analog form. The amplification circuit is configured to process the calibration signal in the analog form to output the audio source signal.

7 Claims, 3 Drawing Sheets

AUDIO DEVICE FOR REDUCING POP NOISE AND PROCESSING METHOD THEREOF

CROSS-REFERENCE TO RELATED APPLICATION

This non-provisional application claims priority under 35 U.S.C. § 119(a) to Patent Application No. 108104170 in Taiwan, R.O.C. on Feb. 1, 2019, the entire contents of which are hereby incorporated by reference.

BACKGROUND

Technical Field

The present invention relates to an audio device for reducing pop noise.

Related Art

Electronic devices are increasingly popular with the advancement and development of technologies. To meet needs of the public, electronic devices are typically equipped with an audio device and an audio playing device for playing audio.

However, when an electronic device is turned on or off, the audio playing device often emits noise as a result of a noise signal. Alternatively, when the audio device is turned on or off, the audio playing device may also emit similar noise. In general, the reason why the audio playing device emits noise is that the audio device has a direct current (DC) offset, and an output voltage of an audio amplifier configured to drive the audio playing device suddenly changes. A frequency of the voltage change caused by the DC offset generally falls within the range of audibility for humans, and therefore the audio playing device outputs annoying noise, which is generally referred to as pop noise.

SUMMARY

In view of the above, the present invention proposes an audio device for reducing pop noise and a processing method thereof.

According to some embodiments, the audio device for reducing pop noise is adapted to compensate for a direct current (DC) offset of an audio source signal and output the audio source signal to an audio playing device. The audio device includes a linear operation circuit, an adder, a digital-to-analog circuit, and an amplification circuit. The digital-to-analog circuit is coupled between the adder and the amplification circuit. The linear operation circuit generates a DC offset value based on a linear equation, a temperature parameter, a slope parameter, and a constant. The adder is configured to process an input signal and the DC offset value to generate a calibration signal. The digital-to-analog circuit is configured to convert a calibration signal in a digital form to a calibration signal in an analog form. The amplification circuit is configured to process the calibration signal in the analog form to output the audio source signal.

The linear equation is:

$$Y = M*X + C$$

where Y is the DC offset value, X is the temperature parameter, M is the slope parameter, and C is the constant.

According to some embodiments, the audio device further includes a temperature sensing circuit. The temperature sensing circuit is coupled to the linear operation circuit. The temperature sensing circuit generates a temperature parameter based on a temperature of the audio device and outputs the temperature parameter to the linear operation circuit.

According to some embodiments, the audio device further includes a storage device. The storage device is coupled to the linear operation circuit. The storage device is configured to store a slope parameter and a constant and output the slope parameter and the constant to the linear operation circuit.

According to some embodiments, the audio device further includes an analog-to-digital circuit. The analog-to-digital circuit is coupled to the amplification circuit and is configured to sense a DC offset value of the audio source signal.

According to some embodiments, the audio device further includes a control circuit. The control circuit is coupled between the analog-to-digital circuit and the storage device. The control circuit adjusts the slope parameter and the constant based on the DC offset value of the audio source signal and outputs the slope parameter and the constant to the storage device.

According to some embodiments, the audio device further includes a switch. The switch is coupled to the amplification circuit. The switch is configured to control an output of the audio device. When the switch is closed, the audio device outputs the audio source signal. When the switch is opened, the audio device does not output the audio source signal.

According to some embodiments, the audio device further includes an audio output terminal. The audio output terminal is coupled to the control circuit. The audio output terminal is configured to output the audio source signal to the audio playing device. When the audio output terminal is coupled to the audio playing device, the audio output terminal outputs a coupling signal to the control circuit. When the audio output terminal is not coupled to the audio playing device, the audio output terminal outputs a disconnection signal to the control circuit.

According to some embodiments, when the control circuit receives the coupling signal, the audio device compensates for the DC offset of the audio source signal based on a power-up process. The power-up process includes: enabling the digital-to-analog circuit, the amplification circuit, the temperature sensing circuit, and the storage device; enabling the linear operation circuit; and outputting, by the control circuit, an on signal to close the switch.

According to some embodiments, the control circuit outputs an off signal based on the disconnection signal to open the switch.

According to some embodiments, an audio processing method for reducing pop noise is adapted to obtain a DC offset value. The DC offset value is used to compensate for a DC offset of an audio source signal. The audio processing method includes: obtaining a slope parameter and a constant based on the DC offset value of the audio source signal; obtaining a temperature parameter; and generating the DC offset value based on a linear equation, the temperature parameter, the slope parameter, and the constant.

In conclusion, the audio device for reducing pop noise of the present invention can generate a DC offset value based on a linear equation, a slope parameter, a constant, and a temperature parameter, so it can compensate for a DC offset value of an audio source signal, thereby reducing the influence of the temperature of the audio device on the DC offset of the audio source signal. According to some embodiments, the audio device further includes a temperature sensing circuit, which measures a temperature of the audio device, and the audio device can adjust the DC offset value based on a change in the temperature of the audio device in real time, thereby effectively compensating for the DC offset of the audio source signal.

DETAILED DESCRIPTION

Figure 1:
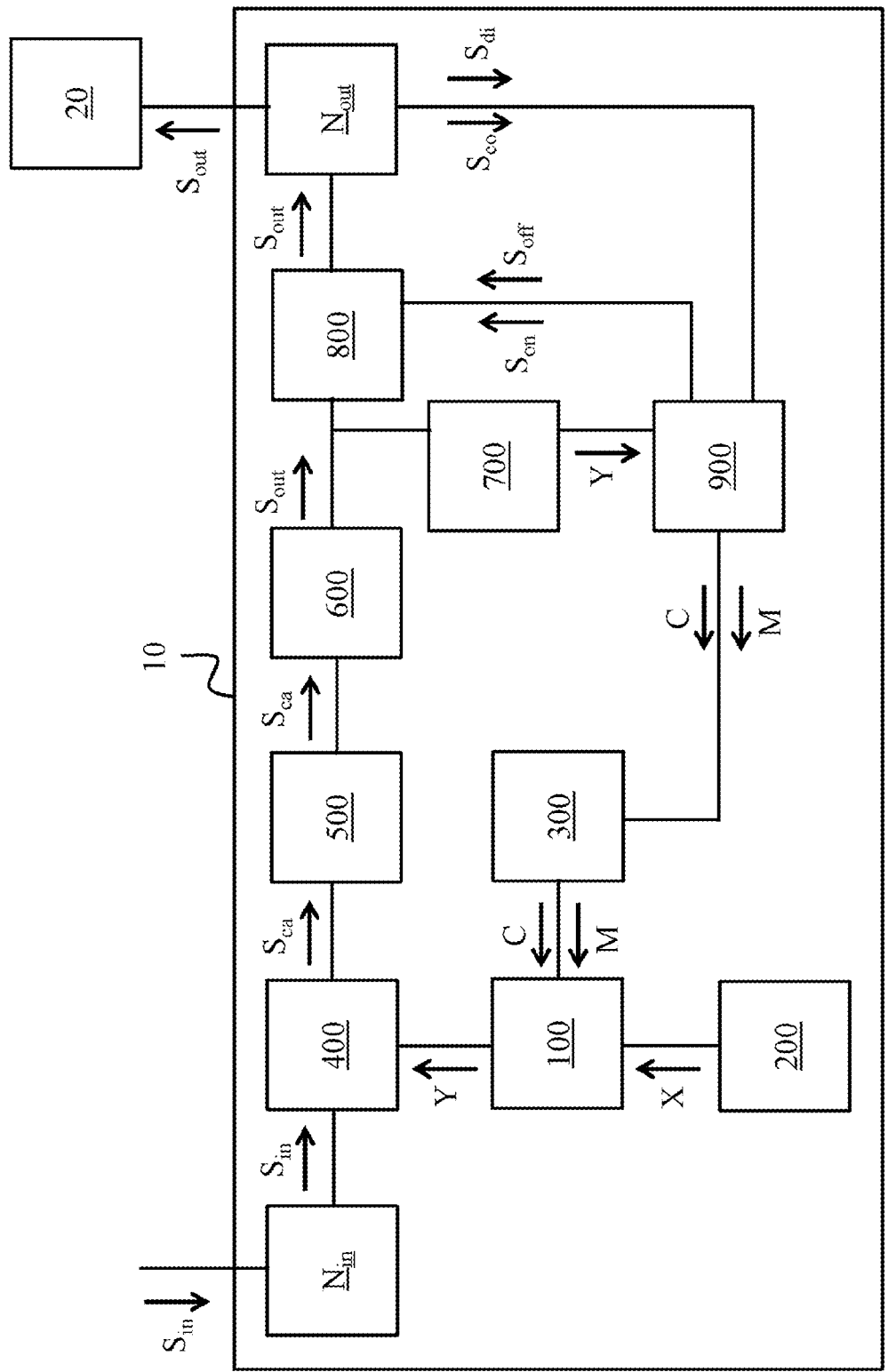
FIG. 1 illustrates a schematic diagram of an audio device according to some embodiments of the present invention.

Reference is made to FIG. 1 which illustrates a schematic diagram of an audio device 10 according to some embodiments of the present invention. In some embodiments, the audio device 10 includes, for example but without limitation, a sound card and a driver or a driving circuit adapted to drive an audio playing device 20 such as an earphone, a speaker, a sound box, etc. to play audio.

In some embodiments, the audio device 10 for reducing pop noise is adapted to compensate for a direct current (DC) offset of an audio source signal $S_{out}$ and output the audio source signal $S_{out}$ to the audio playing device 20. It should be particularly noted that the audio device 10 can compensate for the DC offset of the audio source signal $S_{out}$ by sensing a temperature of the audio device 10. Therefore, when the audio device 10 outputs the audio source signal $S_{out}$ to the audio playing device 20, the audio playing device 20 does not emit pop noise as a result of a DC offset value Y.

To continue, the audio device 10 includes an audio input terminal $N_{out}$, an audio output terminal $N_{out}$, a linear operation circuit 100, a temperature sensing circuit 200, a storage device 300, an adder 400, a digital-to-analog circuit 500, and an amplification circuit 600. The adder 400 is coupled to the audio input terminal $N_{in}$, the linear operation circuit 100, and the digital-to-analog circuit 500. The linear operation circuit 100 is coupled to the temperature sensing circuit 200 and the storage device 300. The digital-to-analog circuit 500 is coupled to the amplification circuit 600.

In some embodiments, the audio device 10 receives an input signal $S_{in}$ from the audio input terminal $N_{in}$, and the audio device 10 outputs the audio source signal $S_{out}$ through the audio output terminal $N_{out}$. The storage device 300 is configured to store a slope parameter M and a constant C and output the slope parameter M and the constant C to the linear operation circuit 100. The temperature sensing circuit 200 generates a temperature parameter X based on the temperature of the audio device 10 and outputs the temperature parameter X to the linear operation circuit 100. The linear operation circuit 100 generates a DC offset value Y based on a linear equation, the temperature parameter X, the slope parameter M. and the constant C. The storage device 300 is, for example but without limitation, a flash memory or a magnetic disc. According to some embodiments, the input signal $S_{in}$ is, for example but without limitation, audio, a noise signal, or a combination of audio and a noise signal.

The linear equation is:

$$Y=M*X+C$$

where Y is the DC offset value, X is the temperature parameter, M is the slope parameter, and C is the constant.

In particular, the slope parameter M and the constant C are fixed values, and the slope parameter M and the constant C have been stored in the storage device 300. The temperature parameter X is measured in real time by the temperature sensing circuit 200 based on the temperature of the audio device 10. In other words, the temperature parameter X is a variable. Therefore, with the linear equation, the linear operation circuit 100 can obtain a different DC offset value Y based on a change in the temperature of the audio device 10. In other words, when the temperature of the audio device 10 changes, the linear operation circuit 100 can adjust the DC offset value Y based on the linear equation and the temperature parameter X. According to some embodiments, the slope parameter M and the constant C are obtained by the audio device 10 in advance based on a relationship between the temperature parameter X and the DC offset value Y.

In some embodiments, the adder 400 is configured to process the input signal $S_{in}$ and the DC offset value Y to generate a calibration signal $S_{ca}$. The digital-to-analog circuit 500 is configured to convert the calibration signal $S_{ca}$ in a digital form to the calibration signal $S_{ca}$ in an analog form. The amplification circuit 600 is configured to process the calibration signal $S_{ca}$ in the analog form to output the audio source signal $S_{out}$. In particular, since the DC offset value Y corresponds to a DC offset before the audio source signal $S_{out}$ is compensated, the input signal $S_{in}$ and the DC offset value Y are combined by the adder 400 to generate the calibration signal $S_{ca}$ in which the DC offset has been compensated, and then the calibration signal $S_{ca}$ is subjected to digital-to-analog conversion and amplification to generate the audio source signal $S_{out}$ in which the DC offset has been compensated.

It should be particularly noted that the input signal $S_{in}$ and the DC offset value Y are signals in a digital form, so the calibration signal $S_{ca}$ generated after the input signal $S_{in}$ and the DC offset value Y are processed by the adder 400 is in a digital form. Both the audio source signal $S_{out}$ and the calibration signal $S_{ca}$ in the analog form are signals in an analog form.

In some embodiments, the audio device 10 further includes an analog-to-digital circuit 700. a switch 800, and a control circuit 900. The switch 800 is coupled to the amplification circuit 600, and the control circuit 900 is coupled to the storage device 300. the analog-to-digital circuit 700, and the switch 800.

In some embodiments, the analog-to-digital circuit 700 is configured to sense the DC offset value Y of the audio source signal $S_{out}$. The control circuit 900 adjusts the slope parameter M and the constant C based on the DC offset value Y of the audio source signal $S_{out}$ and outputs the slope parameter M and the constant C to the storage device 300 to update the slope parameter M and the constant C in the storage device 300.

Figure 2:
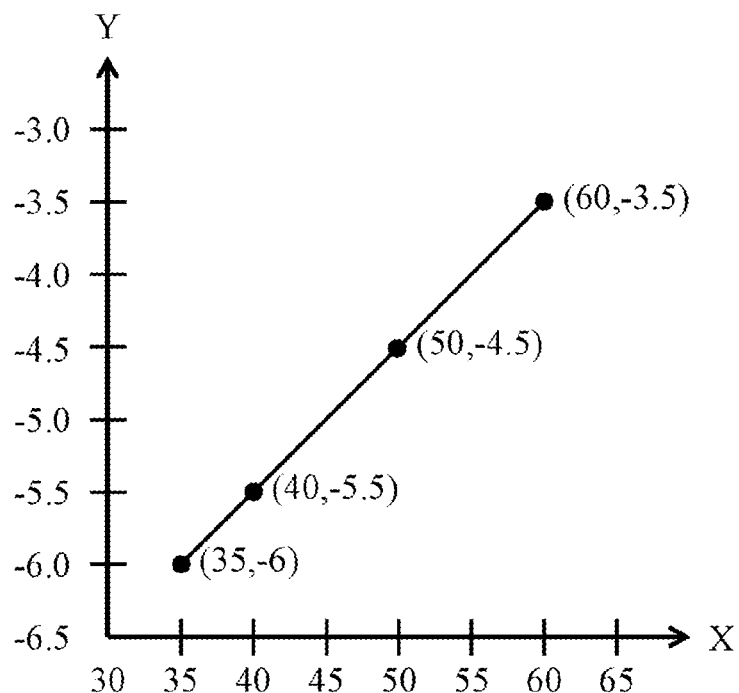
FIG. 2 illustrates a diagram of a relationship between a temperature parameter and a direct current (DC) offset value according to some embodiments of the present invention.

Reference is made to FIG. 2 which illustrates a diagram of a relationship between a temperature parameter X and a DC offset value Y according to some embodiments of the present invention. In some embodiments, when the temperature parameter X of the audio device 10 is 60 degrees Celsius, the DC offset value Y of the audio source signal $S_{out}$ is −3.5 millivolts. When the temperature parameter X of the audio device 10 is 35 degrees Celsius, the DC offset value Y of the audio source signal $S_{out}$ is −6 millivolts. Therefore, the control circuit 900 can derive a linear equation $Y=0.1*X-9.5$ from the relationship between the temperature parameter X and the DC offset value Y (where a slope parameter $M=[-3.5-(-6)]/(60-35)=0.1$, and a constant $C=-6-0.1*(35)=-9.5$). Based on the linear equation $Y=0.1*X-9.5$, the linear operation circuit 100 can obtain the DC offset value Y when the temperature parameter X falls between 35 degrees Celsius and 60 degrees Celsius through interpolation. For example, when the temperature parameter X of the audio device 10 is 40 degrees Celsius, the DC offset value Y is −5.5 millivolts. According to some embodiments, the linear operation circuit 100 can obtain the DC offset value Y through extrapolation, and the temperature parameter X corresponding to the DC offset value Y may be lower than 35 degrees Celsius or higher than 60 degrees Celsius. In other words, the linear operation circuit 100 can obtain the DC offset value Y corresponding to the temperature parameter X with the linear equation, regardless of whether the interpolation or extrapolation is employed.

In some embodiments, the storage device 300 has not stored the slope parameter M and the constant C, and the DC offset value Y output by the linear operation circuit 100 is zero, and therefore the DC offset of the audio source signal $S_{out}$ has not been compensated. The audio device 10 senses the DC offset Y at a high temperature and that at a low temperature respectively; the temperature sensing circuit 200 senses the temperature parameter X: and the analog-to-digital circuit 700 senses the DC offset values Y. When the control circuit 900 obtains the temperature parameters X and the DC offset values Y at the high temperature and the low temperature respectively, the control circuit 900 may obtain the slope parameter M and the constant C and outputs the slope parameter M and the constant C to the storage device 300 to update the slope parameter M and constant C in the storage device 300. Therefore, with the linear equation, the linear operation circuit 100 can obtain a DC offset value Y at a temperature between the high temperature and the low temperature through interpolation, and the linear operation circuit 100 can also obtain a DC offset value Y at a temperature beyond the high temperature or the low temperature through extrapolation.

Still referring to FIG. 1, in some embodiments, the switch 800 is configured to control an output of the audio device 10. When the switch 800 is closed, the audio device 10 outputs the audio source signal $S_{out}$. When the switch 800 is opened, the audio device 10 does not output the audio source signal $S_{out}$. In other words, the switch 800 is configured to control whether the audio output terminal $N_{out}$ outputs the audio source signal $S_{out}$.

In some embodiments, the control circuit 900 is coupled to the audio output terminal $N_{out}$. The audio output terminal $N_{out}$ is configured to output the audio source signal $S_{out}$ to the audio playing device 20. When the audio output terminal $N_{out}$ is coupled to the audio playing device 20, the audio output terminal $N_{out}$ outputs a coupling signal $S_{co}$ to the control circuit 900. When the audio output terminal $N_{out}$ is not coupled to the audio playing device 20, the audio output terminal $N_{out}$ outputs a disconnection signal $S_{di}$ to the control circuit 900. In other words, the control circuit 900 can sense whether the audio output terminal $N_{out}$ is coupled to the audio playing device 20.

Figure 3:
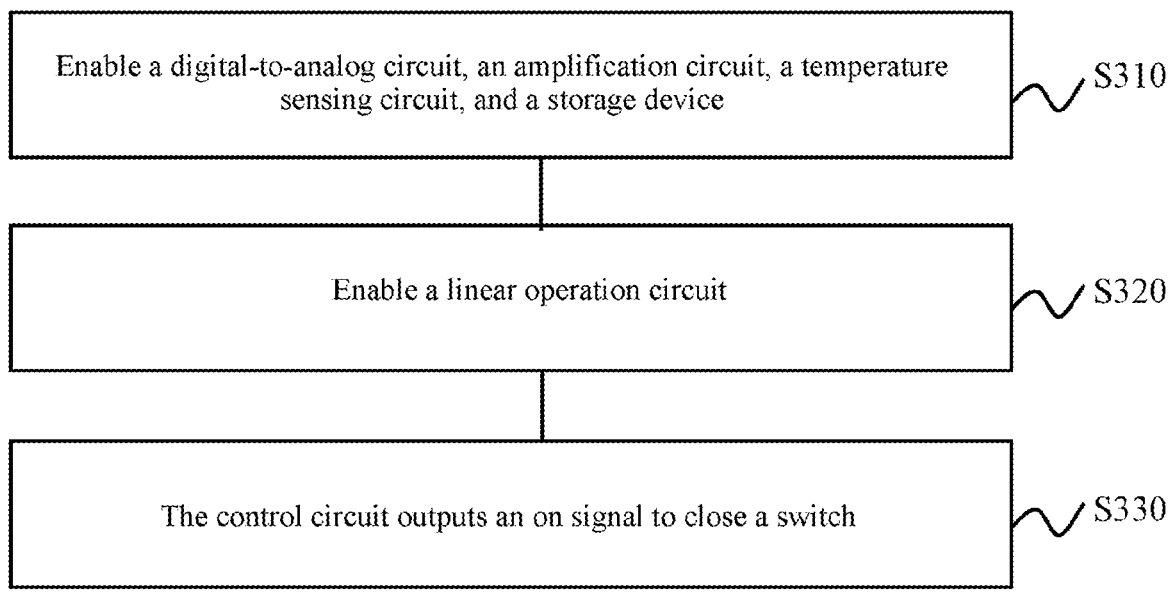
FIG. 3 illustrates a flowchart of a power-up process according to some embodiments of the present invention.

FIG. 3 illustrates a flowchart of a power-up process according to some embodiments of the present invention. Referring to FIG. 3, in some embodiments, when the control circuit 900 receives the coupling signal $S_{co}$, the audio device 10 compensates for the DC offset of the audio source signal $S_{out}$ based on the power-up process. In other words, the case in which the audio output terminal $N_{out}$ is coupled to the audio playing device 20 can be sensed by the audio device 10 through the control circuit 900. Thereafter, the audio device 10 enables components in the audio device 10 based on the power-up process, so that the audio device 10 is capable of compensating for the DC offset of the audio source signal $S_{out}$, and finally the audio device 10 closes the switch 800. The power-up process includes the following steps:

Step S310: Enable the digital-to-analog circuit 500, the amplification circuit 600, the temperature sensing circuit 200, and the storage device 300;

Step S320: Enable the linear operation circuit 100; and

Step S330: The control circuit 900 outputs an on signal $S_{on}$ to close the switch 800.

In some embodiments, when the control circuit 900 receives the disconnection signal $S_{di}$, the control circuit 900 outputs an off signal $S_{off}$ based on the disconnection signal $S_{di}$ to open the switch 800. In particular, when the switch 800 is opened based on the off signal $S_{off}$, the audio device 10 still keeps compensating for the DC offset of the audio source signal $S_{out}$. Therefore, when the audio playing device 20 is disconnected from the audio output terminal $N_{out}$, the audio playing device 20 does not emit pop noise as a result of the DC offset value Y.

Figure 4:
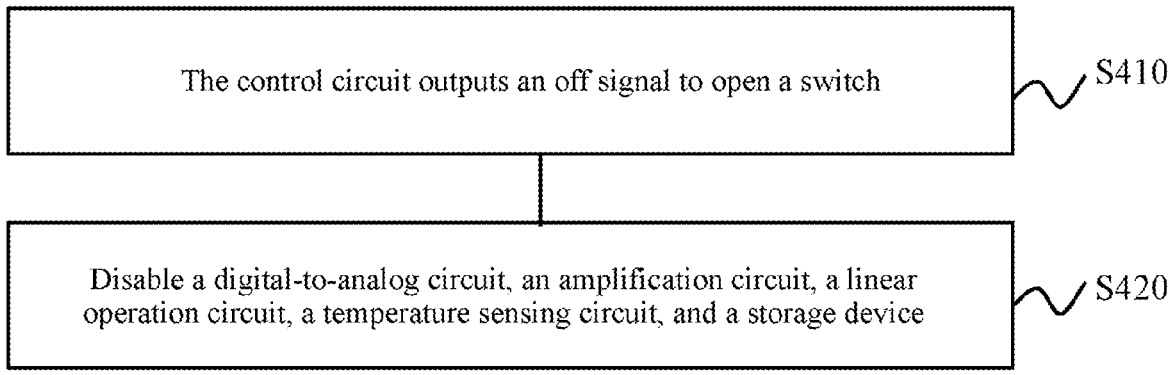
FIG. 4 illustrates a flowchart of a power-off process according to some embodiments of the present invention.

FIG. 4 illustrates a flowchart of a power-off process according to some embodiments of the present invention. Referring to FIG. 4, in some embodiments, when the control circuit 900 receives the disconnection signal $S_{di}$, the audio device compensates for the DC offset of the audio source signal $S_{out}$ based on the power-off process. In other words, the case in which the audio output terminal $N_{out}$ is not coupled to the audio playing device 20 can be sensed by the audio device 10 through the control circuit 900. Thereafter, the audio device 10 opens the switch 800, and finally the audio device 10 disables the components in the audio device 10 based on the power-off process, so that the audio device 10 disables the function of compensating for the DC offset of the audio source signal $S_{out}$. The power-off process includes the following steps:

Step S410: The control circuit 900 outputs an off signal $S_{off}$ to open the switch 800; and Step S420: Disable the digital-to-analog circuit 500, the amplification circuit 600, the linear operation circuit 100, the temperature sensing circuit 200, and the storage device 300.

It should be particularly noted that in some embodiments, step S420 is merely exemplary and is not limited herein. In other words, step S420 is not limited to which components in the audio device 10 are disabled. In particular, step S420 may allow some or all of the components in the audio device 10 to be disabled, or allow no components in the audio device 10 to be disabled.

Figure 5:
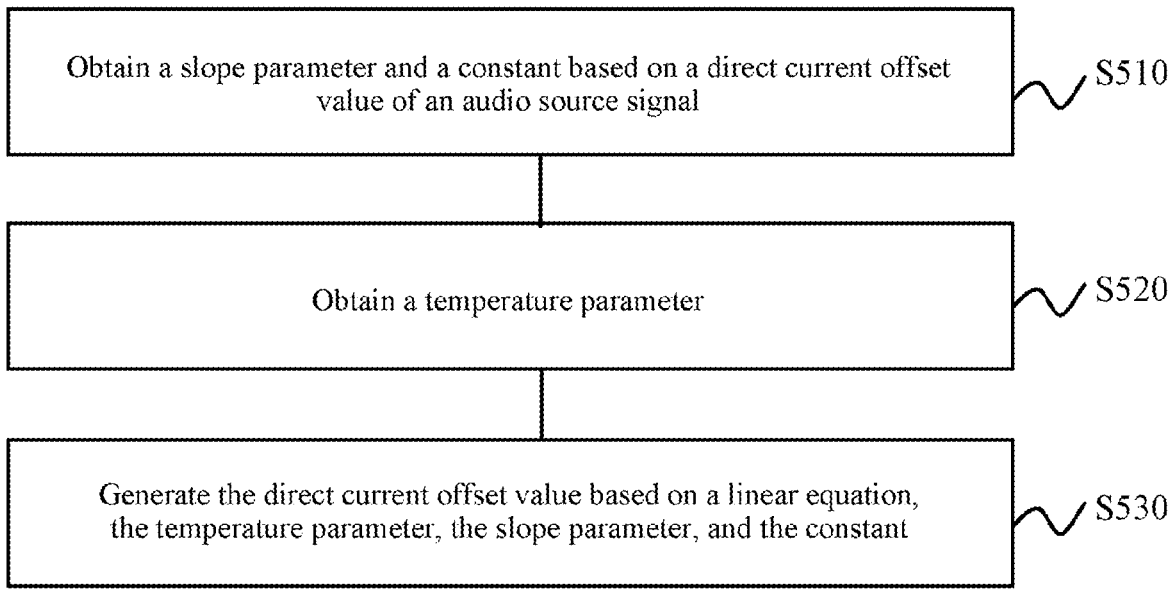
FIG. 5 illustrates a flowchart of an audio processing method according to some embodiments of the present invention.

FIG. 5 illustrates a flowchart of an audio processing method according to some embodiments of the present invention. Referring to FIG. 5, in some embodiments, the audio processing method for reducing pop noise is adapted to obtain a DC offset value Y, where the DC offset value Y corresponds to a DC offset of an audio source signal $S_{out}$, and the audio processing method includes the following steps:

Step S510: Obtain a slope parameter M and a constant C based on the DC offset value Y of the audio source signal $S_{out}$;

Step S520: Obtain a temperature parameter X; and

Step S530: Generate the DC offset value Y based on a linear equation, the temperature parameter X, the slope parameter M, and the constant C.

In conclusion, the audio device 10 for reducing pop noise of the present invention can generate a DC offset value Y based on a linear equation, a slope parameter M, a constant C. and a temperature parameter X, so it can compensate for a DC offset value Y of an audio source signal $S_{out}$, thereby reducing the influence of the temperature of the audio device 10 on the DC offset of the audio source signal $S_{out}$. In some embodiments, the audio device 10 further includes a temperature sensing circuit 200, which measures a temperature of the audio device 10, and the audio device 10 can adjust the DC offset value Y based on a change in the temperature of the audio device 10 in real time, thereby effectively compensating for the DC offset of the audio source signal $S_{out}$.

What is claimed is:

1. An audio device for reducing pop noise, adapted to compensate for a direct current (DC) offset value of an audio source signal and output the audio source signal to an audio playing device, the audio device comprising:
    a linear operation circuit for generating the DC offset value based on a linear equation, a temperature parameter, a slope parameter, and a constant, wherein the linear equation is:

$$Y=M*X+C$$

wherein Y is the DC offset value, X is the temperature parameter, M is the slope parameter, and C is the constant;
    an adder for processing an input signal and the DC offset value to generate a calibration signal;
    a digital-to-analog circuit coupled to the adder, the digital-to-analog circuit being configured to convert the calibration signal in a digital form to the calibration signal in an analog form;
    an amplification circuit coupled to the digital-to-analog circuit, the amplification circuit being configured to process the calibration signal in the analog form to output the audio source signal;
    a temperature sensing circuit coupled to the linear operation circuit, the temperature sensing circuit generating the temperature parameter based on a temperature of the audio device and outputting the temperature parameter to the linear operation circuit;
    a storage device coupled to the linear operation circuit, the storage device being configured to store the slope parameter and the constant and output the slope parameter and the constant to the linear operation circuit; and
    a switch coupled to the amplification circuit, the switch being configured to control an output of the audio device, wherein when the switch is closed, the audio device outputs the audio source signal, and when the switch is opened, the audio device does not output the audio source signal.

2. The audio device according to claim 1, further comprising:
    a control circuit; and
    an audio output terminal coupled to the control circuit, the audio output terminal being configured to output the audio source signal to the audio playing device, wherein when the audio output terminal is coupled to the audio playing device, the audio output terminal outputs a coupling signal to the control circuit, and when the audio output terminal is not coupled to the audio playing device, the audio output terminal outputs a disconnection signal to the control circuit.

3. The audio device according to claim 2, wherein when the control circuit receives the coupling signal, the audio device compensates for the DC offset of the audio source signal based on a power-up process, the power-up process comprising:
    enabling the digital-to-analog circuit, the amplification circuit, the temperature sensing circuit, and the storage device;
    enabling the linear operation circuit; and
    outputting, by the control circuit, an on signal to close the switch.

4. The audio device according to claim 2, wherein the control circuit outputs an off signal based on the disconnection signal to open the switch.

5. An audio device for reducing pop noise, adapted to compensate for a direct current (DC) offset value of an audio source signal and output the audio source signal to an audio playing device, the audio device comprising:
    a linear operation circuit for generating the DC offset value based on a linear equation, a temperature parameter, a slope parameter, and a constant, wherein the linear equation is:

$$Y=M*X+C$$

wherein Y is the DC offset value, X is the temperature parameter, M is the slope parameter, and C is the constant;
    an adder for processing an input signal and the DC offset value to generate a calibration signal;
    a digital-to-analog circuit coupled to the adder, the digital-to-analog circuit being configured to convert a calibration signal in a digital form to a calibration signal in an analog form;
    an amplification circuit coupled to the digital-to-analog circuit, the amplification circuit being configured to process the calibration signal in the analog form to output the audio source signal;
    a temperature sensing circuit coupled to the linear operation circuit, the temperature sensing circuit generating the temperature parameter based on a temperature of the audio device and outputting the temperature parameter to the linear operation circuit;
    a storage device coupled to the linear operation circuit, the storage device being configured to store the slope parameter and the constant and output the slope parameter and the constant to the linear operation circuit;
    an analog-to-digital circuit coupled to the amplification circuit, the analog-to-digital circuit being configured to sense an uncompensated DC offset value of the audio source signal; and
    a control circuit coupled between the analog-to-digital circuit and the storage device, the control circuit adjusting the slope parameter and the constant based on the uncompensated DC offset value of the audio source signal and outputting the slope parameter and the constant to the storage device.

6. An audio processing method for reducing pop noise, adapted to compensate for a direct current (DC) offset value of an audio source signal, the audio processing method comprising:
    obtaining a slope parameter and a constant;
    generating a temperature parameter based on a temperature of an audio device;
    generating the DC offset value based on a linear equation, the temperature parameter, the slope parameter, and the constant, wherein the linear equation is:

$$Y=M*X+C$$

wherein Y is the DC offset value, X is the temperature parameter, M is the slope parameter, and C is the constant;

processing an input signal and the DC offset value to generate a calibration signal;

converting the calibration signal in a digital form to the calibration signal in an analog form;

processing the calibration signal in the analog form to output the audio source signal; and using a switch to control an output of the audio device, wherein when the switch is closed, the audio device outputs the audio source signal, and when the switch is opened, the audio device does not output the audio source signal.

7. An audio processing method for reducing pop noise, adapted to compensate for a direct current (DC) offset value of an audio source signal, the audio processing method comprising:

obtaining a slope parameter and a constant;

generating a temperature parameter based on a temperature of an audio device;

generating the DC offset value based on a linear equation, the temperature parameter, the slope parameter, and the constant, wherein the linear equation is:

$$Y=M*X+C$$

wherein Y is the DC offset value, X is the temperature parameter, M is the slope parameter, and C is the constant;

processing an input signal and the DC offset value to generate a calibration signal;

converting the calibration signal in a digital form to the calibration signal in an analog form;

processing the calibration signal in the analog form to output the audio source signal;

sensing an uncompensated DC offset value of the audio source signal; and adjusting the slope parameter and the constant based on the uncompensated DC offset value of the audio source signal.

* * * * *